(12) United States Patent
Harrison

(10) Patent No.: US 12,308,754 B2
(45) Date of Patent: May 20, 2025

(54) GALLIUM NITRIDE BI-DIRECTIONAL HIGH ELECTRON MOBILITY TRANSISTOR IN SWITCHED-MODE NEUTRAL FORMING DEVICE APPLICATIONS

(71) Applicant: Enphase Energy, Inc., Petaluma, CA (US)

(72) Inventor: Michael J. Harrison, Petaluma, CA (US)

(73) Assignee: Enphase Energy, Inc., Petaluma, CA (US)

(*) Notice: Subject to any disclaimer, the term of this patent is extended or adjusted under 35 U.S.C. 154(b) by 229 days.

(21) Appl. No.: 17/734,640

(22) Filed: May 2, 2022

(65) Prior Publication Data
US 2022/0360187 A1    Nov. 10, 2022

Related U.S. Application Data

(60) Provisional application No. 63/184,179, filed on May 4, 2021.

(51) Int. Cl.
| | |
|---|---|
| *H02M 5/293* | (2006.01) |
| *H02M 1/08* | (2006.01) |
| *H10D 30/47* | (2025.01) |
| *H10D 62/85* | (2025.01) |

(52) U.S. Cl.
CPC ............. *H02M 5/293* (2013.01); *H02M 1/08* (2013.01); *H10D 30/475* (2025.01); *H10D 62/8503* (2025.01)

(58) Field of Classification Search
CPC ..... H02M 5/293; H02M 1/08; H01L 29/2003; H01L 29/7786; H10D 30/475; H10D 62/8503
See application file for complete search history.

(56) References Cited

U.S. PATENT DOCUMENTS

| | | | |
|---|---|---|---|
| 4,922,400 A | 5/1990 | Cook | |
| 5,198,971 A | 3/1993 | Recker et al. | |
| 8,169,179 B2 * | 5/2012 | Mohan | H02M 7/53873 318/722 |

(Continued)

FOREIGN PATENT DOCUMENTS

| | | | | |
|---|---|---|---|---|
| CN | 104701364 A | * | 6/2015 | |
| CN | 110323955 B | * | 12/2020 | ................ H01P 5/12 |

(Continued)

OTHER PUBLICATIONS

Umesh K. Pulication â AlGaN/GaN HEMTsaAn Overview of Device Operation and Applicationsâ, Proceedings of the IEEE, vol. 90, No. 6, Jun. 2002 (Year: 2002).*

(Continued)

*Primary Examiner* — Thienvu V Tran
*Assistant Examiner* — Yahveh Comas Torres
(74) *Attorney, Agent, or Firm* — Moser Taboada

(57) ABSTRACT

A switched-mode neutral forming device is provided herein and comprises one or more windings coupled to (i) a plurality of line terminals via a plurality of switches and (ii) a neutral terminal, wherein each switch of the plurality of switches is a native four quadrant bi-directional switch and a controller, coupled to the plurality of switches, for driving the switches at a frequency orders or magnitude greater than an AC mains frequency.

20 Claims, 5 Drawing Sheets

(56) References Cited

U.S. PATENT DOCUMENTS

| | | | |
|---|---|---|---|
| 9,130,570 B2 * | 9/2015 | Fornage | H03K 17/693 |
| 9,634,552 B2 | 4/2017 | Dent | |
| 10,454,383 B1 * | 10/2019 | Wang | H02M 3/33592 |
| 11,152,918 B1 * | 10/2021 | Koplow | H02M 5/225 |
| 2009/0065810 A1 | 3/2009 | Honea et al. | |
| 2012/0287688 A1 * | 11/2012 | Fornage | H03K 17/693 |
| | | | 327/429 |
| 2014/0268959 A1 | 9/2014 | Frohman et al. | |
| 2015/0016169 A1 * | 1/2015 | Honea | H02M 7/5387 |
| | | | 363/132 |
| 2016/0093691 A1 * | 3/2016 | Echigoya | H01L 29/063 |
| | | | 257/76 |
| 2020/0119179 A1 * | 4/2020 | Mishra | H01L 29/42356 |
| 2021/0036625 A1 * | 2/2021 | Itoh | H02J 50/12 |
| 2021/0391311 A1 * | 12/2021 | Rhodes | H01L 25/18 |

FOREIGN PATENT DOCUMENTS

| | | | | |
|---|---|---|---|---|
| JP | 5669119 B1 * | 2/2015 | | H01L 29/0619 |
| KR | 20160109745 A * | 9/2016 | | H02M 5/458 |

OTHER PUBLICATIONS

Machine Translation CN-104701364-A (Year: 2015).*
Machine Translation JP-5669119-B1 (Year: 2015).*
PCT International Search Report and Written Opinion for Application PCT/US2022/027253 dated Aug. 18, 2022, 10 pgs.
Li et al., "Carrier Based Pulse Width Modulation for Matric Converters", Applied Power Electronics Conference and Exposition, 2009. APEC 2009, Twenty-Fourth Annual IEEE, IEEE Piscataway, NJ, Feb. 15, 2009, pp. 1709-1715, XP031442921, ISBNH: 978-1-4244-2811-3.

* cited by examiner

GALLIUM NITRIDE BI-DIRECTIONAL HIGH ELECTRON MOBILITY TRANSISTOR IN SWITCHED-MODE NEUTRAL FORMING DEVICE APPLICATIONS

CROSS-REFERENCE TO RELATED APPLICATIONS

The present application claims the benefit of and priority to U.S. Provisional Application Ser. No. 63/184,179, filed May 4, 2021, the entire contents of which is incorporated herein by reference.

BACKGROUND

Field of the Disclosure

Embodiments of the disclosure relate to neutral forming devices and, in particular, switched-mode neutral forming devices utilizing bi-directional switches.

Description of the Related Art

The AC power grid for North American and Japanese residential connections differs from the configuration used throughout the rest of the world. Both North American and Japanese residential connections are based on a split-phase (180° 2-phase) configuration, in particular 120V/240 Vac for North America and 100V/200 Vac for Japan, allowing for a mix of single-phase (e.g., 120 Vac in North America) and two-phase (e.g., 240 Vac in North America) appliances and loads to be used in the residential site. For these types of connections to function properly, the AC mains neutral voltage needs to be kept at voltage that is the mid-way potential between the two phase voltages. This function is known as "neutral forming" and is provided by power utility residential distribution transformers.

When a neutral point is required, a neutral forming device such as a neutral forming transformer is necessary to provide the required neutral in order for a site to disconnect from the commercial AC power grid, for example to operate as a microgrid. A conventional neutral forming transformer, which can be designed for single-phase applications or for three-phase applications, is traditionally built using an "Iron & Copper" line frequency (i.e., 50 or 60 Hz) transformer. Such a traditional line frequency neutral forming transformer is physically bulky (i.e., heavy and large) and costly to manufacture.

Therefore, the inventors have provided a smaller and less costly local neutral forming device for off-grid facilities.

SUMMARY

In accordance with at least some embodiments of the present disclosure, a switched-mode neutral forming device comprises one or more windings coupled to (i) a plurality of line terminals via a plurality of switches and (ii) a neutral terminal, wherein each switch of the plurality of switches is a native four quadrant bi-directional switch and a controller, coupled to the plurality of switches, for driving the switches at a frequency orders or magnitude greater than an AC mains frequency.

In accordance with at least some embodiments of the present disclosure, a switched-mode neutral forming device comprises one or more windings coupled to (i) a plurality of line terminals via a plurality of switches and (ii) a neutral terminal, wherein each switch of the plurality of switches is a native four quadrant bi-directional switch, wherein the plurality of switches are operable in one of a split-phase configuration or three-phase configuration and a controller, coupled to the plurality of switches, for driving the switches at a frequency orders or magnitude greater than an AC mains frequency.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure generally relate to switched-mode neutral forming devices comprising native bi-directional switches. The neutral forming devices utilize electronic switched-mode techniques to artificially increase the frequency that is processed. Since the physical size of the neutral forming device is inversely proportional to the frequency that is required to process, the techniques described herein achieve a physically small, lightweight, low-cost, and highly efficient neutral forming device. In some embodiments, the neutral forming device is a switched-mode neutral forming transformer having a volume on the order of 1,000 times smaller than an equivalent-rated conventional line frequency based neutral forming transformer.

The switched-mode neutral forming device utilizes bi-directional switches to accommodate the alternating polarity of an AC grid voltage. These bi-directional switches are four quadrant bi-directional switches (also referred to as 4QS), for example gallium nitride (GaN) high mobility electron transistor (HEMT) switches, built as native 4QS devices. Such GaN HEMT 4QS devices have higher performance at a lower cost than 4QS devices composed of a back-to-back pair of conventional unidirectional GaN HEMT devices.

Figure 1:
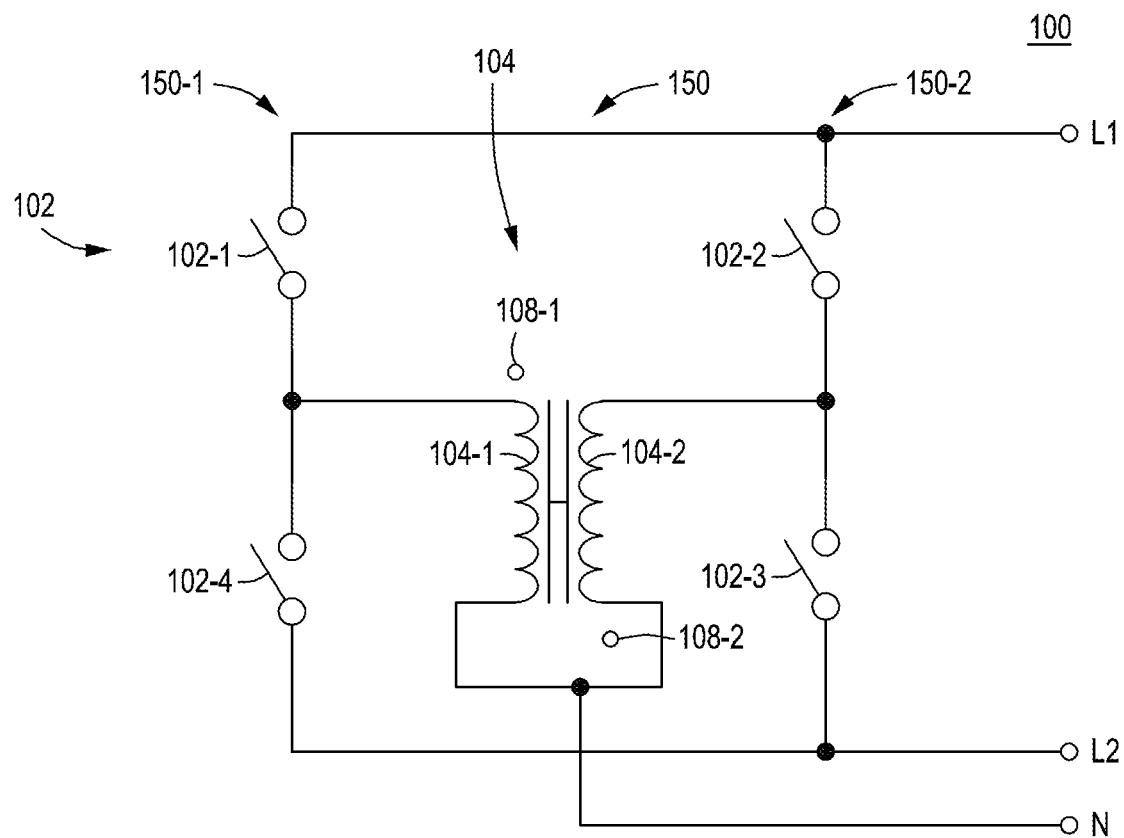
FIG. 1 is a schematic diagram of a switched-mode neutral forming device in accordance with embodiments of the present disclosure.
Figure 1:
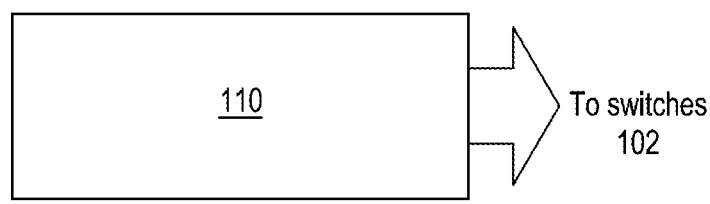
Figure 4:
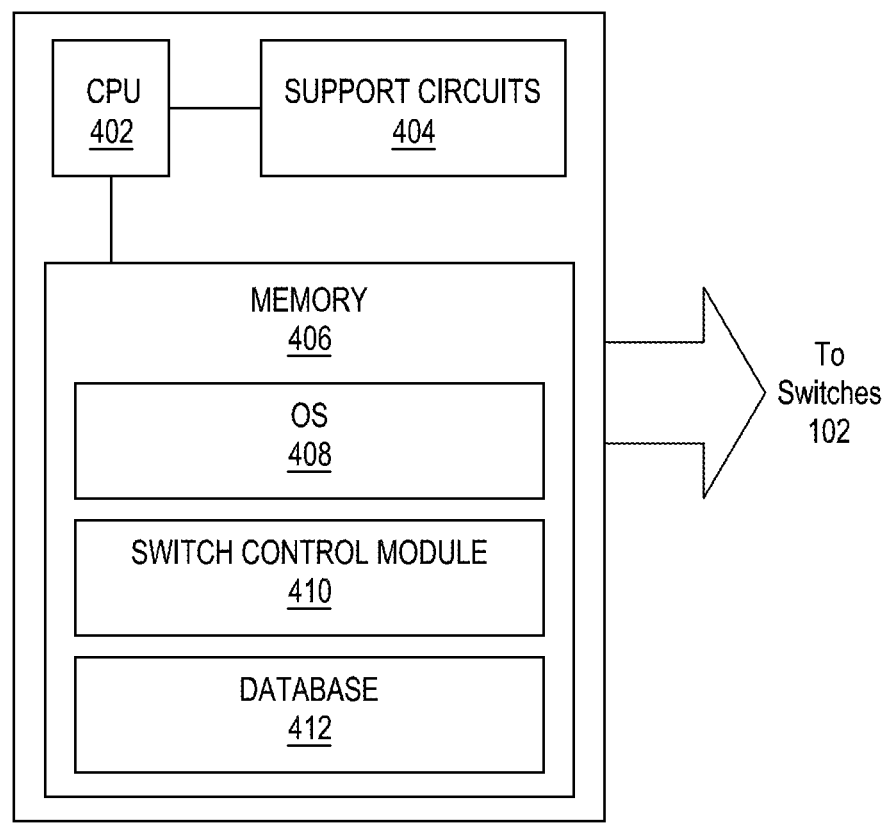
FIG. 4 is a block diagram of a controller in accordance with embodiments of the present disclosure.

FIG. 1 is a schematic diagram of a switched-mode neutral forming device 100 in accordance with embodiments of the present disclosure. The switched-mode neutral forming device 100 (which may also be referred to as neutral forming transformer) is a split-phase device and comprises switches 102-1, 102-2, 102-3, and 102-4, collectively referred to as switches 102, and a transformer 104. The switches 102 are coupled to one another in an H-bridge configuration (H-bridge 150) where the switches 102-1 and 102-4 are coupled in series to form a first H-bridge leg 150-1, and the switches 102-2 and 102-3 are coupled in series to form a second H-bridge leg 150-2. A controller 110, described in detail further below with respect to FIG. 4, is coupled to each of the switches 102 and drives the operation of the switches 102 (i.e., switching ON/OFF).

The transformer 104 comprises a first portion 104-1 and a second portion 104-2. The first portions 104-1 is coupled between the middle of the first H-bridge leg 150-1 (i.e., a terminal of the first portion 104-1 is coupled between the switches 102-1 and 102-4) and a neutral terminal N of the switched-mode neutral forming device 100. The second portion 104-2, having opposite polarity of the first portion 104-1, is coupled between the neutral terminal N and the middle of the second H-bridge leg (i.e., a terminal of the second portion 104-2 is coupled between the switches 102-2 and 102-3). Depicted dots 108-1 and 108-2 indicate the start of the phasing of the windings. For example, the dot 108-1 is depicted at the end of the first portion 104-1 that is coupled between the switch 102-1 and the switch 102-4, and the dot 108-2 is depicted at the end of the second portion 104-2 that is coupled to the neutral terminal N. A first line terminal L1 is coupled to the top of the H-bridge configuration 150, and a second line terminal L2 is coupled to the bottom of the H-bridge configuration 150.

Each of the switches 102-1 through 102-4 is a native four quadrant bi-directional switch, described in detail further below with respect to FIG. 5, which can be switched ON/OFF at frequencies much greater than the AC mains line frequency. For example, for an AC mains frequency of 60 Hz, the switching frequency of the switched-mode neutral forming device 100 may be 1000 times that (e.g., 60 kHz). Likewise, for an AC mains frequency of 50 Hz, the switching frequency of the switched-mode neutral forming device 100 may be 50 kHz. Since the physical size of the transformer 104 is inversely proportional to the frequency that it is required to process, the transformer 104 may be, for example, 1,000 times smaller volume than an equivalent-rated conventional line frequency based neutral forming transformer that processes frequencies on the order of 50 Hz or 60 Hz.

Figure 2:
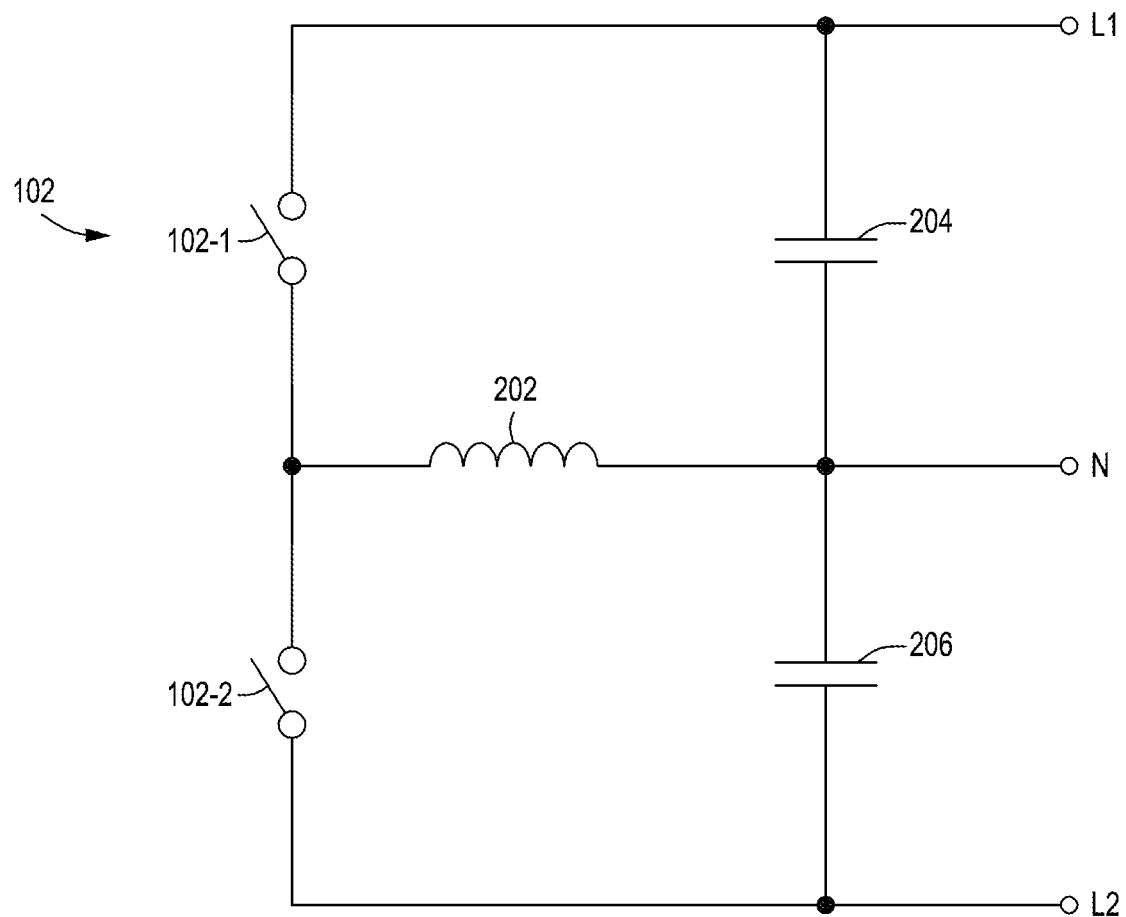
FIG. 2 is a schematic diagram of another switched-mode neutral forming device in accordance with embodiments of the present disclosure.
Figure 2:
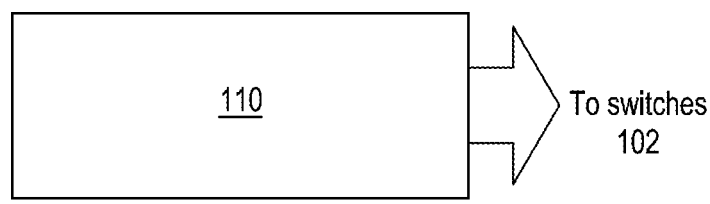

FIG. 2 is a schematic diagram of a switched-mode neutral forming device 200 in accordance with embodiments of the present disclosure. The switched-mode neutral forming device 200 is a split-phase device comprising switches 102-1 and 102-2 (e.g., two bi-directional switches), an inductor 202, and capacitors 204 and 206. In some embodiments, the capacitors 204 and 206 may have the same capacitive values.

A series configuration of the switches 102-1 and 102-2 (e.g., connected in series with one another) is coupled across a series configuration of the capacitors 204 and 206 (e.g., two capacitors), as well as across load-side line terminals L1 and L2. A load-side neutral terminal N is coupled to the point where the capacitors 204 and 206 are coupled to one another.

The inductor 202 has a first terminal coupled to the point where the switches 102-1 and 102-2 are coupled to one another. A second terminal of the inductor 202 is coupled to the neutral terminal N. The controller 110 is coupled to the switches 102 and drives the operation of the switches 102 (i.e., switching ON/OFF).

Analogous to the operation of the neutral forming device 100, the switches 102 of the neutral forming device 200 are operated at a frequency much greater than the AC grid frequency, for example at a frequency or 50 kHz or 60 kHz, in order to increase the frequency that is processed and thereby enable the switched-mode neutral forming device 200 to be much smaller than an equivalent-rated conventional line frequency based device.

Figure 3:
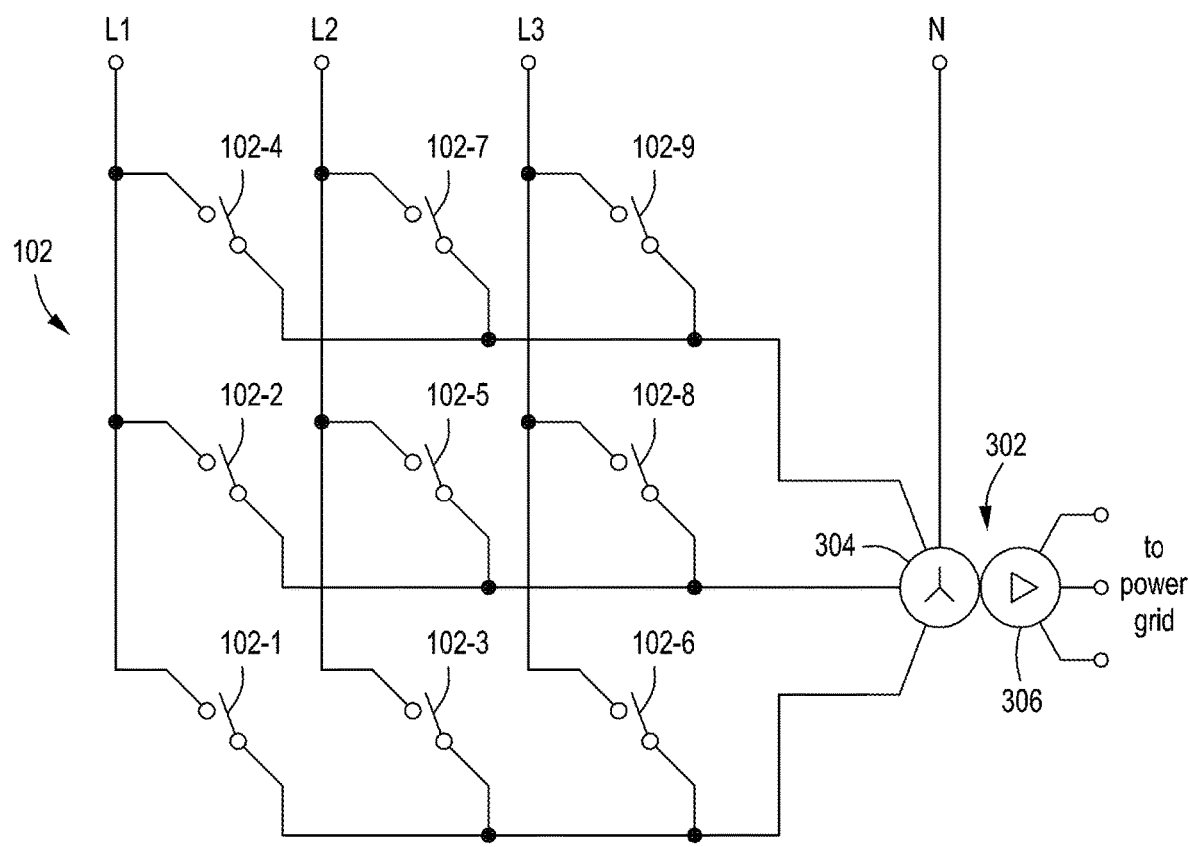
FIG. 3 is a schematic diagram of another switched-mode neutral forming device in accordance with embodiments of the present disclosure.
Figure 3:
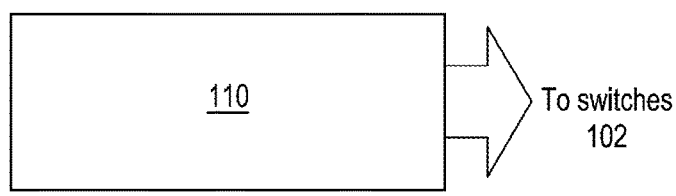

FIG. 3 is a schematic diagram of a switched-mode neutral forming device 300 in accordance with embodiments of the present disclosure. The switched-mode neutral forming device 300 is a three-phase device comprising switches 102-1 through 102-9 (e.g., nine bi-directional switches), and a star-delta transformer 302 having a star winding 304 on the load side (i.e., three windings on the secondary side connected together in a star configuration) and a delta winding 306 on the power grid side (i.e., three windings on the primary side connected in a delta configuration).

The nine bi-directional switches 102-1 through 102-9 are coupled to one another in a matrix of that is further coupled to the star winding 304. The switches 102-1, 102-2, and 102-4 (e.g., a first set of three of the nine bi-directional switches) are respectively coupled between a line terminal L1 and a first terminal of the star winding 304, the line terminal L1 and a second terminal of the star winding 304, and the line terminal L1 and a third terminal of the star winding 304. The switches 102-3, 102-5, and 102-7 (e.g., a second set of three of the nine bi-directional switches) are respectively coupled between a line terminal L2 and the first terminal of the star winding 304, the line terminal L2 and the second terminal of the star winding 304, and the line terminal L2 and the third terminal of the star winding 304. The switches 102-6, 102-8, and 102-9 (e.g., a third set of three of the nine bi-directional switches) are respectively coupled between a line terminal L3 and the first terminal of the star winding 304, the line terminal L3 and the second terminal of the star winding 304, and the line terminal L3 and the third terminal of the star winding 304. A neutral terminal N is coupled to the centerpoint of the star winding 304.

The controller 110 is coupled to the switches 102 and drives the operation of the switches 102 (i.e., switching ON/OFF).

During operation, at any given time three of the switches 102 are activated (i.e., ON) to effectively transpose the connections to the line terminals L1, L2, and L3 such that the frequency seen by the star winding 304 is artificially made high. Analogous to the neutral forming devices 100 and 200, the switches 102 of the neutral forming device 300 are operated at a frequency much greater than the AC grid frequency, for example at a frequency or 50 kHz or 60 kHz, thereby enabling the switched-mode neutral forming device 300 to be much smaller than an equivalent-rated conventional line frequency based device.

FIG. 4 is a block diagram of the controller 110 in accordance with embodiments of the present disclosure. The controller 110 comprises support circuits 404 and a memory 406, each coupled to a CPU 402 (central processing unit). The CPU 402 may comprise one or more conventionally available microprocessors or microcontrollers. Additionally or alternatively, the CPU 402 may include one or more application specific integrated circuits (ASICs). The controller 110 may be implemented using a general purpose computer that, when executing particular software, becomes a specific purpose computer for performing various embodiments of the present disclosure. In one or more embodiments, the CPU 402 may be a microcontroller comprising internal memory for storing controller firmware that, when executed, provides the controller functionality described herein.

The support circuits 404 are well known circuits used to promote functionality of the CPU 402. Such circuits include, but are not limited to, a cache, power supplies, clock circuits, buses, input/output (I/O) circuits, and the like.

The memory 406 may comprise random access memory, read only memory, removable disk memory, flash memory, and various combinations of these types of memory. The memory 406 is sometimes referred to as main memory and may, in part, be used as cache memory or buffer memory. The memory 406 generally stores an OS 408 (operating system), if necessary, of the controller 110 that can be supported by the CPU capabilities. In some embodiments, the OS 408 may be one of a number of commercially available operating systems such as, but not limited to, LINUX, Real-Time Operating System (RTOS), and the like.

The memory 406 stores various forms of application software, such as a switch control module 410 which, when executed, implements the switching techniques described herein to control the activation and deactivation of the switches 102.

The memory 406 additionally stores a database 412, for example for storing data related to the operation of the neutral forming devices 100, 200, and 300, and/or other data.

Figure 5:
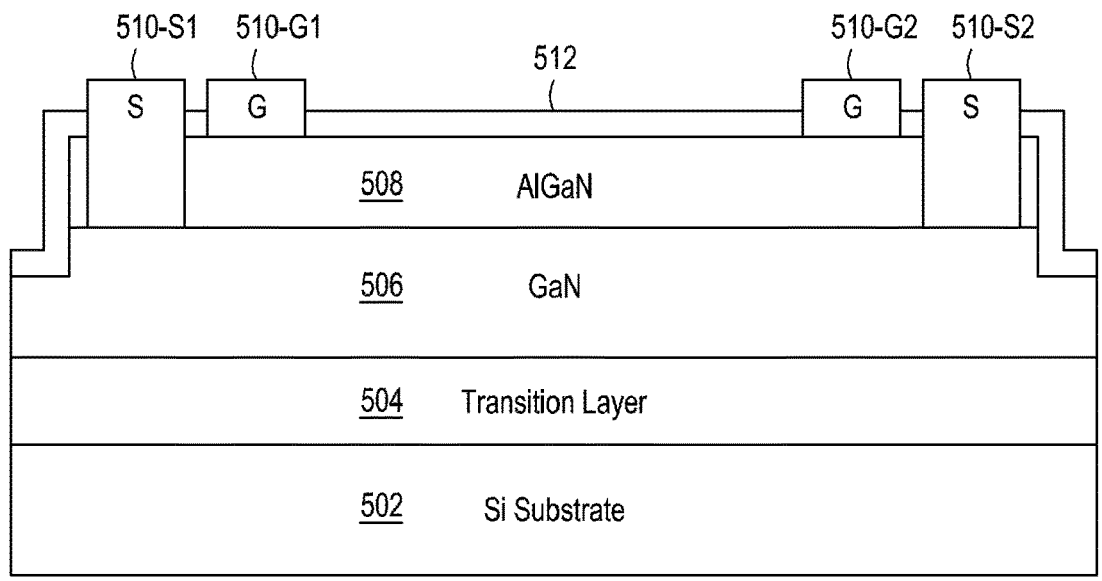
FIG. 5 is a cross-sectional view depicting a structure of a switch in accordance with one or more embodiments of the present disclosure.

FIG. 5 is a cross-sectional view depicting a structure of the switch 102 in accordance with one or more embodiments of the present disclosure. The switch 102 is a gallium nitride (GaN) high electron mobility transistor (HEMT) structure comprising layers 502, 504, 506, 508, and 512 with source terminals 510-S1/510-S2 and gate terminals 510-G1/510-G2 coupled to the layer 508. In contrast to a conventional uni-directional GaN HEMT switch, which is fabricated as a lateral device with a drift region between drain and source connections being parallel to the top surface of the GaN die, the switch 102 comprises two gate-source structures (one of which is used in place of the drain structure of the conventional uni-directional GaN HEMT switch) to facilitate the switch 102. As such, the switch 102 allows the common drift region to be used in either direction (i.e., for current flowing in the direction from the source terminal 510-S1 to the source terminal 510-S2, or for current flowing in the direction from the source terminal 510-S2 to the source terminal 510-S1) and block either a positive or a negative voltage, thereby providing a GaN area reduction as compared to a conventional 4QS device fabricated by connecting two conventional GaN HEMT devices together. In various embodiments, the switch 102 may have a die area that is half of the die area of a conventional unidirectional GaN HEMT and thus provide a 4:1 die area advantage as compared to a pair of conventional unidirectional GaN HEMTs connected together to form a 4QS device. Further, the ratio of gate drive loss to conduction loss ratio (i.e., $Q_G/R_{SS-ON}$) for the switch 102 is two times lower than for a GaN 4QS constructed out of two conventional uni-directional GaN HEMT devices due to the 2:1 die area per switch difference (only one of the gates 510-G1, 510-G2 is switched at any given time).

As depicted in FIG. 5, the base layer 502 is a silicon (Si) substrate, typically on the order of 0.7 mm thick. The layer 504, which is sandwiched between the layers 502 and 506, is a transition layer (which in some embodiments may comprise two or more different elements), typically on the order of a few nano-meters thick. The layer 506, which is sandwiched between the layers 504 and 508, is a gallium nitride (GaN) layer, typically on the order of a few micro-meters thick. The layer 508, atop the layer 506, is an aluminum gallium nitride (AlGaN) layer, typically on the order of a few micro-meters thick. The layer 512, which sits atop the layer 508, is an inert passivation layer (e.g., a glass-like deposited layer) that is used to prevent impurities from the environment from leaching into the switch 102.

The source terminals 510-S1/510-S2 are typically thin metal layers with composition known in the art to make ohmic contact to the layer 508, and the gate terminals 510-G1/510-G2 are typically thin metal layers with composition known in the art that produce a Schottky contact to the layer 508.

In some alternative embodiments, other types of materials and/or structures may be used for the switch 102. For example; wide bandgap materials other than GaN, such as silicon carbide, may be utilized, and/or a structure other than the HEMT structure, such as a metal-oxide-semiconductor field-effect transistor (MOSFET) structure, may be used.

Examples of the switch 102 may be found in commonly assigned U.S. Pat. No. 9,130,570, titled "Four Quadrant Bidirectional Switch", which is herein incorporated by reference in its entirety.

Figure 6:
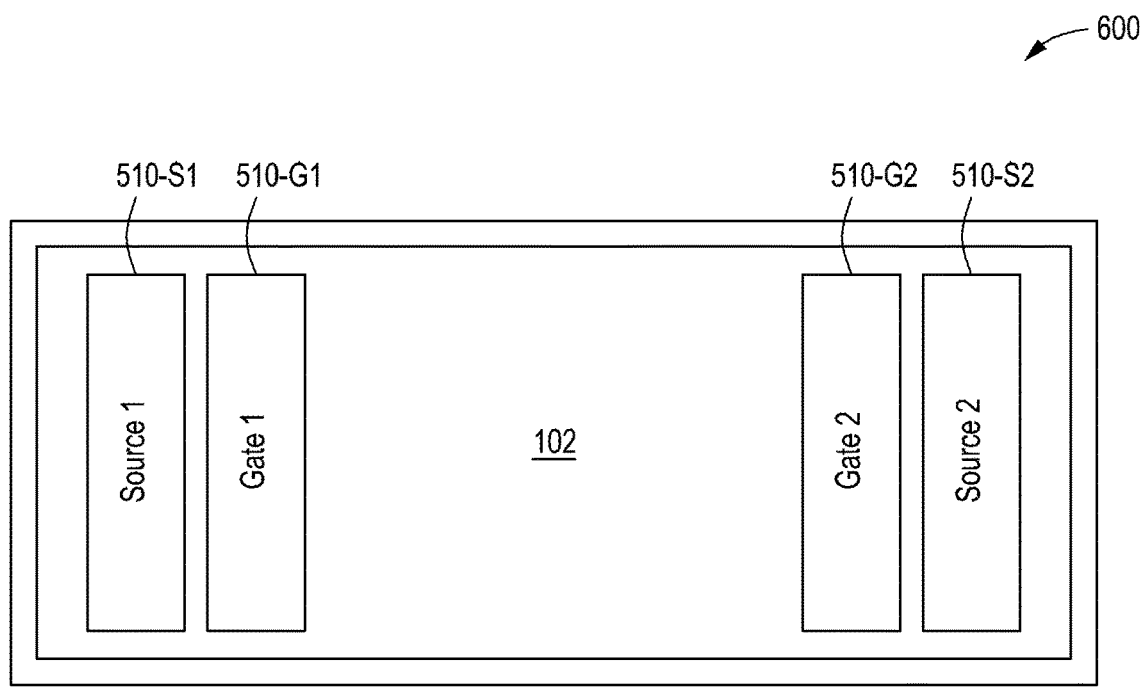
FIG. 6 is a plan view of the switch in accordance with embodiments of the present disclosure.

FIG. 6 is a plan view 600 of the switch 102 in accordance with embodiments of the present disclosure. The plan view of the switch 102 depicts the source and gate terminals 510-S1 and 510-G1 located near one another at one end of the top of the switch 102, and the source and gate terminals 510-S2 and 510-G2 located near one another at the opposite end of the top of the switch 102.

The foregoing description of embodiments of the disclosure comprises a number of elements, devices, circuits and/or assemblies that perform various functions as described. These elements, devices, circuits, and/or assemblies are exemplary implementations of means for performing their respectively described functions.

While the foregoing is directed to embodiments of the present disclosure, other and further embodiments of the disclosure may be devised without departing from the basic scope thereof, and the scope thereof is determined by the claims that follow.

The invention claimed is:

1. A switched-mode neutral forming device, comprising:
one or more windings coupled to (i) a plurality of line terminals via a plurality of switches and (ii) a neutral terminal, wherein each switch of the plurality of switches is a native four quadrant bi-directional switch that is a gallium nitride (GaN) high mobility electron transistor (HEMT) comprising two gate-source structures that extend to an aluminum gallium nitride (AlGaN) layer, one of which used in place of a drain which allows a common drift region to be used for at least one of current flowing in a direction from a first source terminal to a second source terminal, for current flowing in a direction from the second source terminal to the first source terminal, or to block either a positive or a negative voltage;
an inert passivation layer that contacts and covers a top surface of the aluminum gallium nitride (AlGaN) layer and extends at least partially along a gallium nitride (GaN) layer; and
a controller, coupled to the plurality of switches, for driving the switches at a frequency orders or magnitude about 1000 times greater than an AC mains frequency such that a switching frequency of the switched-mode neutral forming device is about 50 KHz to about 60 KHz.

2. The switched-mode neutral forming device of claim 1, wherein the switched-mode neutral forming device is a split-phase device.

3. The switched-mode neutral forming device of claim 2, wherein the switched-mode neutral forming device comprises two bi-directional switches, an inductor, and two capacitors.

4. The switched-mode neutral forming device of claim 3, wherein the two capacitors have the same capacitive values.

5. The switched-mode neutral forming device of claim 3, wherein the two bi-directional switches are connected in series with one other and coupled across a series configuration of the two capacitors and across load-side line terminals.

6. The switched-mode neutral forming device of claim 5, wherein a load-side neutral terminal N is coupled to a point where the two capacitors and are coupled to one another.

7. The switched-mode neutral forming device of claim 6, wherein the inductor has a first terminal coupled to a point where the two bi-directional switches are coupled to one another and a second terminal coupled to the neutral terminal.

8. The switched-mode neutral forming device of claim 1, wherein the switched-mode neutral forming device is a three-phase device.

9. The switched-mode neutral forming device of claim 8, wherein the switched-mode neutral forming device comprises nine bi-directional switches and a star-delta transformer having a star winding on a load side and a delta winding on a power grid side.

10. The switched-mode neutral forming device of claim 9, wherein the nine bi-directional switches are coupled to one another in a matrix and coupled to the star winding, and wherein a neutral terminal is coupled to a centerpoint of the star winding.

11. The switched-mode neutral forming device of claim 10, wherein a first set of three of the nine bi-directional switches are respectively coupled between a first line terminal and a first terminal of the star winding, the first line terminal and a second terminal of the star winding, and the first line terminal and a third terminal of the star winding.

12. The switched-mode neutral forming device of claim 10, wherein a second set of three of the nine bi-directional switches are respectively coupled between a second line terminal and a first terminal of the star winding, the second line terminal and a second terminal of the star winding, and the second line terminal and a third terminal of the star winding.

13. The switched-mode neutral forming device of claim 10, wherein a third set of three of the nine bi-directional switches are respectively coupled between a third line terminal and a first terminal of the star winding, the third line terminal and a second terminal of the star winding, and the third line terminal and a third terminal of the star winding.

14. The switched-mode neutral forming device of claim 1, wherein the gallium nitride (GaN) high mobility electron transistor (HEMT) comprises:
a base layer;
a transition layer disposed atop the base layer;
the gallium nitride (GaN) layer is disposed atop the transition layer; and
the aluminum gallium nitride (AlGaN) layer is disposed atop the gallium nitride (GaN) layer,
wherein the two gate-source structures comprises source terminals that extend to the gallium nitride (GaN) layer and gate terminals that extend to the aluminum gallium nitride (AlGaN) layer.

15. The switched-mode neutral forming device of claim 1, wherein the source terminals and the gate terminals are at least partially surrounded by the inert passivation layer.

16. The switched-mode neutral forming device of claim 1, wherein a ratio of gate drive loss to conduction loss ratio for the plurality of switches is based on a die area per switch difference that provides for only one of the gates of two gate-source structures to be switched at any given time during operation.

17. The switched-mode neutral forming device of claim 1, wherein the inert passivation layer covers the entire top surface of the aluminum gallium nitride (AlGaN) layer.

18. A switched-mode neutral forming device, comprising:
one or more windings coupled to (i) a plurality of line terminals via a plurality of switches and (ii) a neutral terminal, wherein each switch of the plurality of switches is a native four quadrant bi-directional switch that is a gallium nitride (GaN) high mobility electron transistor (HEMT) comprising two gate-source structures that extend to an aluminum gallium nitride (AlGaN) layer, one of which used in place of a drain which allows a common drift region to be used for at least one of current flowing in a direction from a first source terminal to a second source terminal, for current flowing in a direction from the second source terminal to the first source terminal, or to block either a positive or a negative voltage, wherein the plurality of switches are operable in one of a split-phase configuration or three-phase configuration;
an inert passivation layer that contacts and covers a top surface of the aluminum gallium nitride (AlGaN) layer and extends at least partially along a gallium nitride (GaN) layer; and
a controller, coupled to the plurality of switches, for driving the switches at a frequency orders or magnitude about 1000 times greater than an AC mains frequency such that a switching frequency of the switched-mode neutral forming device is about 50 KHz to about 60 KHz.

19. The switched-mode neutral forming device of claim 18, wherein in the split-phase configuration, the switched-mode neutral forming device comprises two bi-directional switches, an inductor, and two capacitors and in three-phase configuration the switched-mode neutral forming device comprises nine bi-directional switches and a star-delta transformer having a star winding on a load side and a delta winding on a power grid side.

20. The switched-mode neutral forming device of claim 18, wherein a ratio of gate drive loss to conduction loss ratio for the plurality of switches is based on a die area per switch difference that provides for only one of the gates of two gate-source structures to be switched at any given time during operation.

* * * * *